US012560360B2

(12) United States Patent
Zhong

(10) Patent No.: US 12,560,360 B2
(45) Date of Patent: Feb. 24, 2026

(54) DIRECT DOWNHOLE ELECTRICITY GENERATION IN A GEOTHERMAL WELL

(71) Applicant: Halliburton Energy Services, Inc., Houston, TX (US)

(72) Inventor: Xiaoguang Allan Zhong, Singapore (SG)

(73) Assignee: Halliburton Energy Services, Inc., Houston, TX (US)

( * ) Notice: Subject to any disclaimer, the term of this patent is extended or adjusted under 35 U.S.C. 154(b) by 196 days.

(21) Appl. No.: 17/978,834

(22) Filed: Nov. 1, 2022

(65) Prior Publication Data

US 2024/0142140 A1 May 2, 2024

(51) Int. Cl.
  *F24T 10/15* (2018.01)
  *F24T 50/00* (2018.01)
  *H10N 10/10* (2023.01)
  *H10N 10/13* (2023.01)

(52) U.S. Cl.
  CPC ............... *F24T 10/15* (2018.05); *F24T 50/00* (2018.05); *H10N 10/10* (2023.02); *H10N 10/13* (2023.02); *Y02E 10/10* (2013.01)

(58) Field of Classification Search
  CPC ......... H10N 10/10; H10N 10/13; F24T 50/00; F24T 10/15; F28D 7/024; F28D 7/028; F28D 7/022; F28D 7/02; F28D 7/10
  See application file for complete search history.

(56) References Cited

U.S. PATENT DOCUMENTS

| | | | |
|---|---|---|---|
| 9,580,981 B2 | 2/2017 | Zhong et al. | |
| 10,060,217 B2 | 8/2018 | Murphree et al. | |
| 11,268,335 B2 | 3/2022 | Vick et al. | |
| 2002/0185168 A1* | 12/2002 | Hunt | H10N 10/13 |
| | | | 136/208 |
| 2003/0010652 A1 | 1/2003 | Hunt | |
| 2006/0213669 A1 | 9/2006 | Shipley et al. | |
| 2007/0151591 A1 | 7/2007 | Jeffryes | |
| 2011/0100586 A1* | 5/2011 | Yang | F28D 20/0034 |
| | | | 165/47 |
| 2017/0107795 A1 | 4/2017 | Yeo et al. | |

(Continued)

FOREIGN PATENT DOCUMENTS

| | | | | |
|---|---|---|---|---|
| CN | 201629703 U | * | 11/2010 | |
| CN | 106223312 | | 12/2016 | |
| CN | 107846158 A | * | 3/2018 | H02N 11/002 |

(Continued)

OTHER PUBLICATIONS

CN-107846158-A English machine translation (Year: 2018).*

(Continued)

*Primary Examiner* — Andrew J Golden
(74) *Attorney, Agent, or Firm* — Scott Richardson; C. Tumey Law Group PLLC

(57) ABSTRACT

Systems and methods of the present disclosure relate to generating electricity by pumping fluid into a thermoelectric conduit that extends into a geothermal reservoir. A method includes pumping fluid into at least one thermoelectric conduit that extends into the geothermal reservoir. The method further includes generating electricity with the thermoelectric conduit due to a temperature differential between the fluid and the geothermal reservoir.

20 Claims, 7 Drawing Sheets

(56)          References Cited

U.S. PATENT DOCUMENTS

2021/0222548 A1     7/2021  Steele et al.

FOREIGN PATENT DOCUMENTS

| | | | |
|---|---|---|---|
| CN | 113224979 A | * | 8/2021 |
| CN | 113224979 | | 12/2021 |
| CN | 115013995 | | 9/2022 |
| EP | 2935760 A1 | | 10/2015 |
| WO | 2018222198 A1 | | 12/2018 |
| WO | 2020185208 A1 | | 9/2020 |

OTHER PUBLICATIONS

CN-113224979-A English machine translation (Year: 2021).*
CN-106223312-A English machine translation (Year: 2016).*
CN 201629703 U English machine translation (Year: 2010).*
Cn 115013995A English machine translation (Year: 2022).*
International Search Report and Written Opinion for International Patent Application No. PCT/US2022/050476 dated Jul. 20, 2023.
Li et al., Cost Estimation of Thermoelectric Generators, Proceedings, 46th Workshop on Geothermal Reservoir Engineering, Feb. 15-17, 2021, Stanford, California.
https://www.fchea.org/fuelcells accessed Oct. 31, 2022.
https://en.wikipedia.org/wiki/Thermoelectric_effect accessed Oct. 31, 2022.
https://en.wikipedia.org/wiki/Thermoelectric_generator accessed Oct. 31, 2022.
https://en.wikipedia.org/wiki/Thermoelectric_materials accessed Oct. 31, 2022.

* cited by examiner

600 — PUMPING FLUID INTO A THERMOELECTRIC CONDUIT THAT EXTENDS INTO A GEOTHERMAL RESERVOIR

602 — GENERATING ELECTRICITY WITH THE THERMOELECTRIC CONDUIT DUE TO A TEMPERATURE DIFFERENTIAL BETWEEN THE OD AND THE ID OF THE THERMOELECTRIC CONDUIT

604 — RECOVERING ELECTRICITY FROM THE THERMOELECTRIC CONDUIT

DIRECT DOWNHOLE ELECTRICITY GENERATION IN A GEOTHERMAL WELL

BACKGROUND

Renewable energy includes geothermal energy such as heat that is continuously generated inside Earth's core. Geothermal energy is an important component for transitioning to renewable and clean energy. It can replace nuclear energy and fossil fuel for electricity generation. Current geothermal energy efforts primarily focus on how to extract geothermal energy from a subterranean formation and transport the geothermal energy to power plants to generate electricity or for other purpose (e.g., hot water, heating).

The typical process includes pumping cold water into a hot zone of the subterranean formation, bringing the heated water back up to the surface, and then transporting the hot water or steam to power plants to generate electricity. A substantial amount of heat is lost during the surface transport, due to the related infrastructure.

BRIEF DESCRIPTION OF THE DRAWINGS

These drawings illustrate certain aspects of some examples of the present disclosure and should not be used to limit or define the disclosure.

DETAILED DESCRIPTION

Figure 1A:
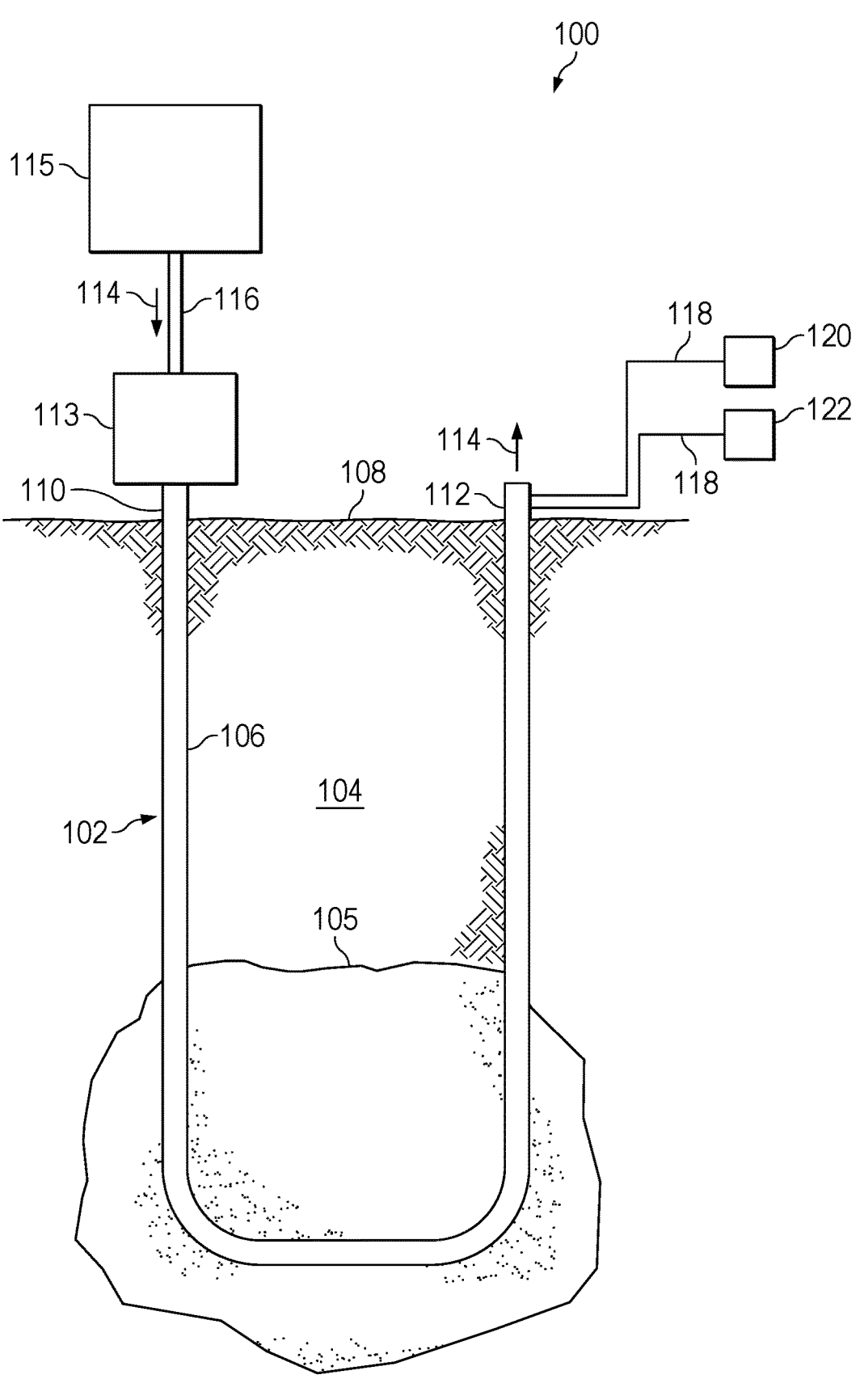
FIG. 1A illustrates an operating environment for generating electricity downhole using geothermal energy, in accordance with examples of the present disclosure.

The present disclosure relates to generating electricity downhole using geothermal energy. Specifically, the step of transporting downhole heat to power plants is eliminated to improve an energy conversion rate and further reduce a carbon footprint. A thermoelectric device/material may be implemented to generate electricity due to a temperature differential (e.g., 5°-10°) across the device.

In geothermal energy applications, the temperature differential across the thermoelectric material may be relatively constant or otherwise maintained. In some examples, a continuous flow of electricity may be produced via a thermoelectric conduit/pipe that includes an outer diameter (OD) exposed to a heat source (e.g., a geothermal reservoir), and an inner diameter (ID) exposed to a cold source (e.g., water). In some examples, a thermoelectric pipe may be at least partially made of a thermoelectric material. In some examples, the thermoelectric material may include a coating and/or a plating. In some examples, the thermoelectric material may be embedded into casing. In some examples, the thermoelectric material may be included/integrated with another metal such as steel, for example. In some examples, the thermoelectric material may be included in the entire length of the conduit. In other examples, the thermoelectric material may be included in at least 5 feet, in at least 10 feet, in at least 15 feet, or in at least 20 feet of the conduit. In some examples, the cold source may be at least 5° or at least 10° colder than the heat source. The heat source may be for example, at least 5° or at least 10° warmer than the cold source. The thermoelectric conduit may be placed into a heat reservoir (e.g., a geothermal well), and cold water may be pumped into the thermoelectric conduit to maintain a cold temperature on the ID of the conduit. The OD of the conduit may remain hot due to the limitless heat source from the geothermal well (in its production life span).

The temperature differential between hot and cold sides of the conduit/pipe cause electricity to be generated continuously with the continuous flow of cold water through the conduit. As the hot fluid around the thermoelectric pipe cools down due to energy transfer, convection occurs, and cooler fluid drops to the bottom to the well, where a constant heat source exists. The hot fluid from the bottom of the well/zone rises up to the surface of the well.

The cold fluid may be pumped down a well and a minimum amount of energy is required to sustain the flow. The thermoelectric conduit uses a built-in temperature differential to generate electricity. No moving parts allow for improved durability. Also, there is no need to bring heat from the subterranean formation to the surface, allowing for a reduced carbon footprint for geothermal wells.

To increase the electricity output, surface area of the thermoelectric pipe may be increased. For example, multiple U-shaped pipes may be connected in parallel flow configurations, where multiple thermoelectric U-shaped pipes are in a single underground heat reservoir. Helical-shaped pipes to increase each thermoelectric generator's surface area, may also be used. Multiple helical shaped thermoelectric pipes may be connected such that the flow therethrough is also parallel. In some examples, the helical-shaped thermoelectric pipes may be connected separately or inside each other. The parallel connections allow for increased electricity production.

FIG. 1A illustrates an example of a well system 100 for generating electricity downhole using geothermal energy, in accordance with examples of the present disclosure. The well system 100 may include a wellbore 102 formed within a subterranean formation 104. The wellbore 102 may be a vertical wellbore as illustrated or it may be a horizontal and/or a directional well. While the well system 100 may be illustrated as land-based, it should be understood that the present techniques may also be applicable in offshore applications. The subterranean formation 104 may be made up of several geological layers and include a geothermal reservoir (s) 105 with temperatures ranging from for example, 70° F. to 350° F. or higher.

A conduit 106 may extend through the wellbore 102 from the surface 108. The conduit 106 may include an inlet 110 and an outlet 112 at the surface 108. The conduit 106 may extend down from the inlet 110, through the geothermal reservoir(s) 105, and back up to the surface 108 via the outlet 112. A pump 113 may be coupled to the inlet 110 for pumping fluid 114 into the conduit 106. A fluid source 115 may supply the fluid 114 to the pump 113 via a pipe 116. The fluid 114 may exit the conduit 106 from the outlet 112 for recycling into the conduit 106, or further processing.

Figure 1B:
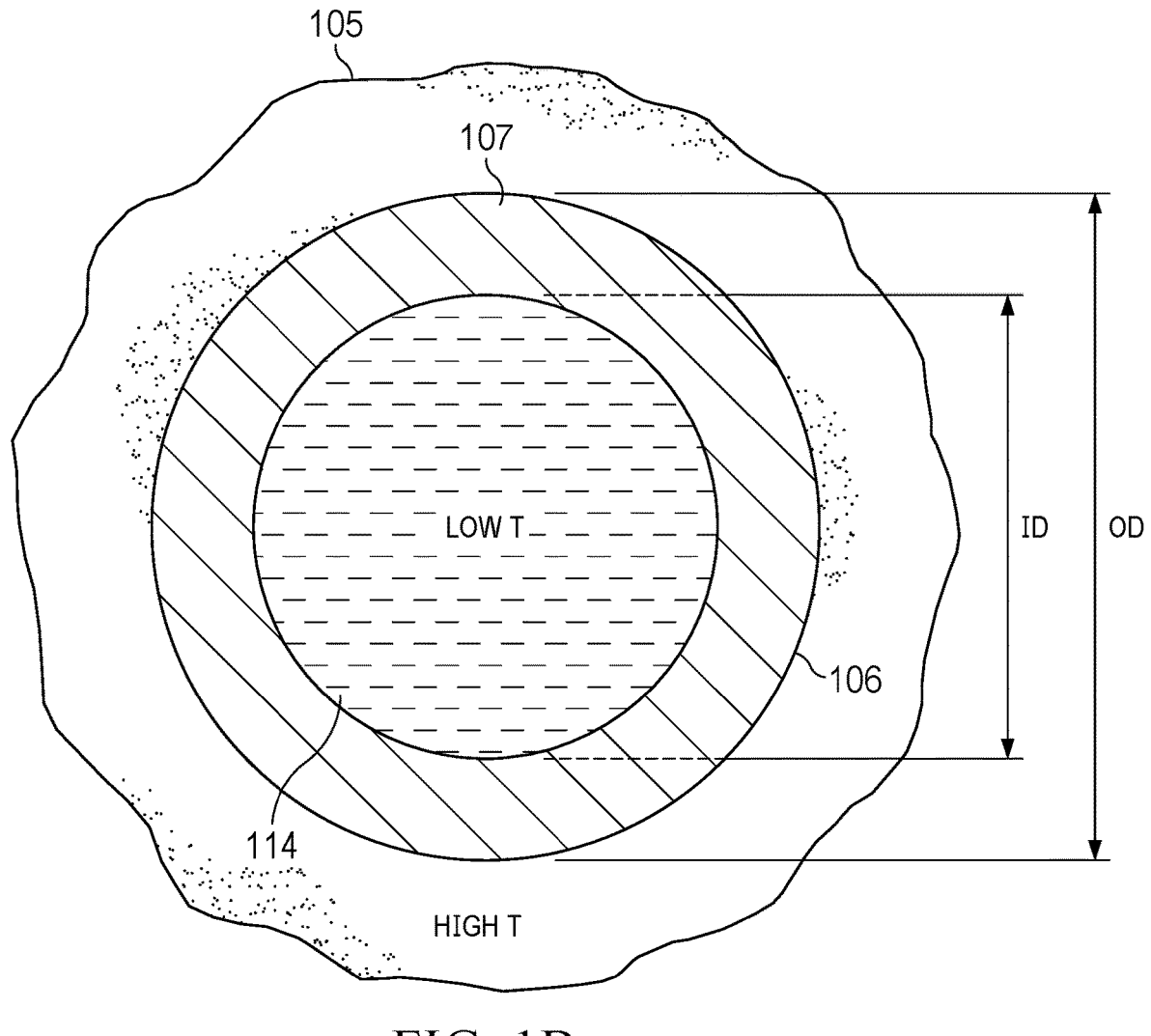
FIG. 1B illustrates a cross-sectional view of a thermoelectric conduit, in accordance with examples of the present disclosure.

With additional reference to FIG. 1B (a cross-sectional view of the conduit 106), the conduit 106 may be made of a thermoelectric material 107 (e.g., bismuth telluride). A Seebeck effect generates a voltage with the thermoelectric material 107 from a temperature difference encountered in the subterranean formation (e.g., pumped-in cold water contacting the hot subterranean geothermal zone). The ID of the conduit 106 has a lower temperature due to the pumped-in cooler fluid 114 that is in contact with the ID.

The OD of the conduit 106 has a higher temperature due to the geothermal reservoir 105. The fluid 114 may include cold water or water with an ambient temperature, or water that is at least 5° F. or at least 10° F. colder than geothermal reservoir(s) 105. The temperature difference is sufficient to produce energy via the thermoelectric material 107. Referring back to FIG. 1A, a cable(s) 118 (e.g., wires) may extend from the conduit 106 to transfer generated electricity from the conduit 106 to an electrical grid 120 and/or a battery 122, for example.

The cold water may be pumped into the thermoelectric conduit 106 to maintain a cold temperature on the ID of the pipe. The OD of the pipe may remain hot due to the limitless heat source from the geothermal well (in its production life span).

The temperature differential between hot and cold sides of the pipe cause electricity to be generated continuously with a continuous flow of cold water. As the hot fluid around the thermoelectric pipe cools down a bit due to energy transfer, convection occurs, and cooler fluid drop to the bottom to the well, where a constant heat source exists. The hot fluid from the bottom of the well/zone rises up to the surface 108.

The cold fluid may be pumped down, but not a lot of energy is required to sustain the flow. The thermoelectric pipe uses a built-in temperature differential to generate electricity. No moving parts allow for improved durability. Also, there is no need to bring heat from the subterranean formation to the surface, allowing for a reduced carbon footprint for geothermal wells. To increase the electricity output, surface area of the conduit 106 may be increased.

Figure 2:
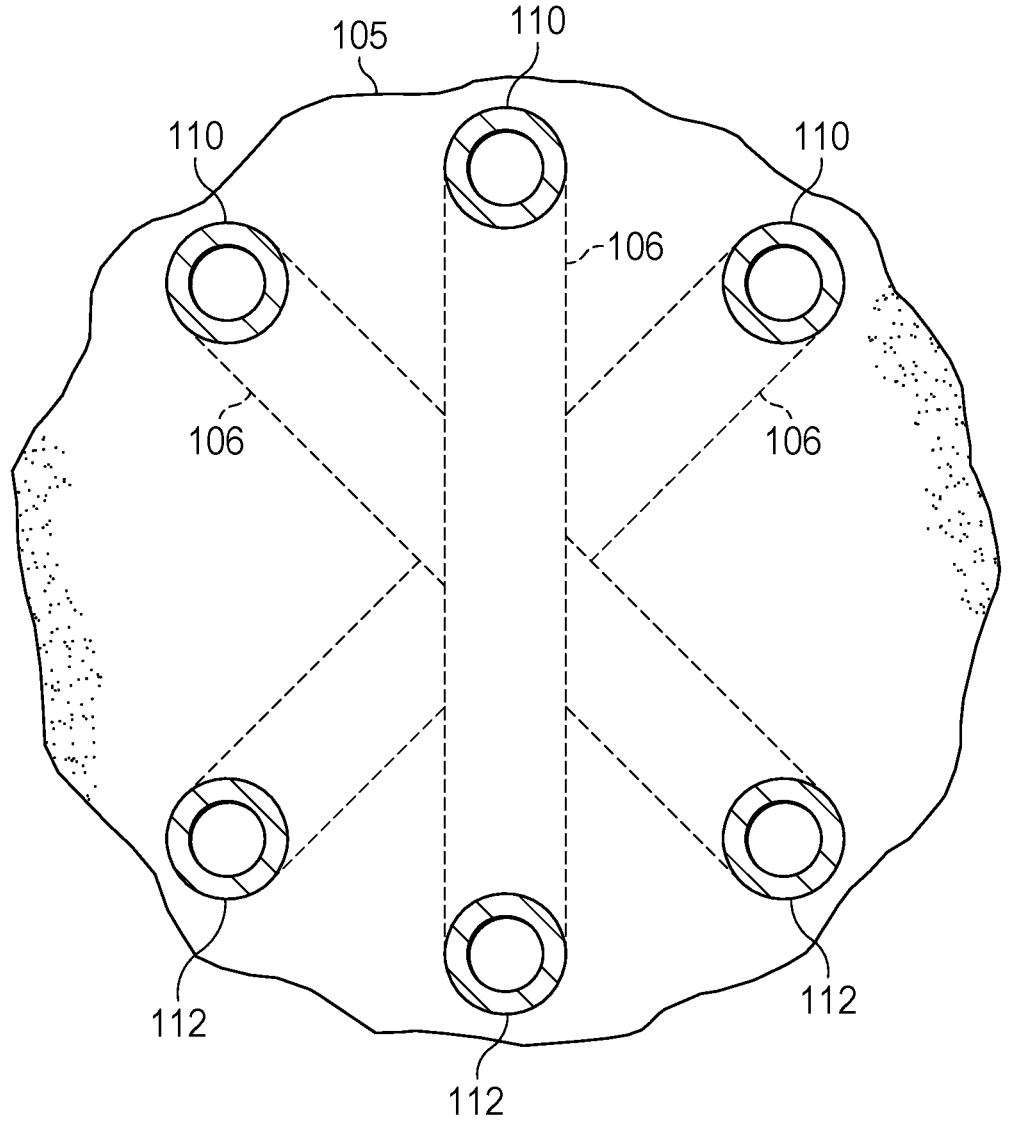
FIG. 2 illustrates a cross-sectional view of a geothermal reservoir that includes multiple U-shaped conduits connected in parallel flow configurations, in accordance with examples of the present disclosure.

FIG. 2 illustrates a cross-sectional view (e.g., top view) of the geothermal reservoir 105 that includes multiple U-shaped conduits 106 connected in parallel flow configurations, in accordance with examples of the present disclosure. For example, the multiple U-shaped conduits 106 are connected in parallel flow configurations within a single underground heat reservoir (e.g., the geothermal reservoir 105), to increase the electricity output. The multiple U-shaped conduits 106 increase surface area for the thermoelectric material allowing for an increase in electricity generation. Each conduit 106 includes an inlet 110 and an outlet 112, as set forth previously.

Figure 3:
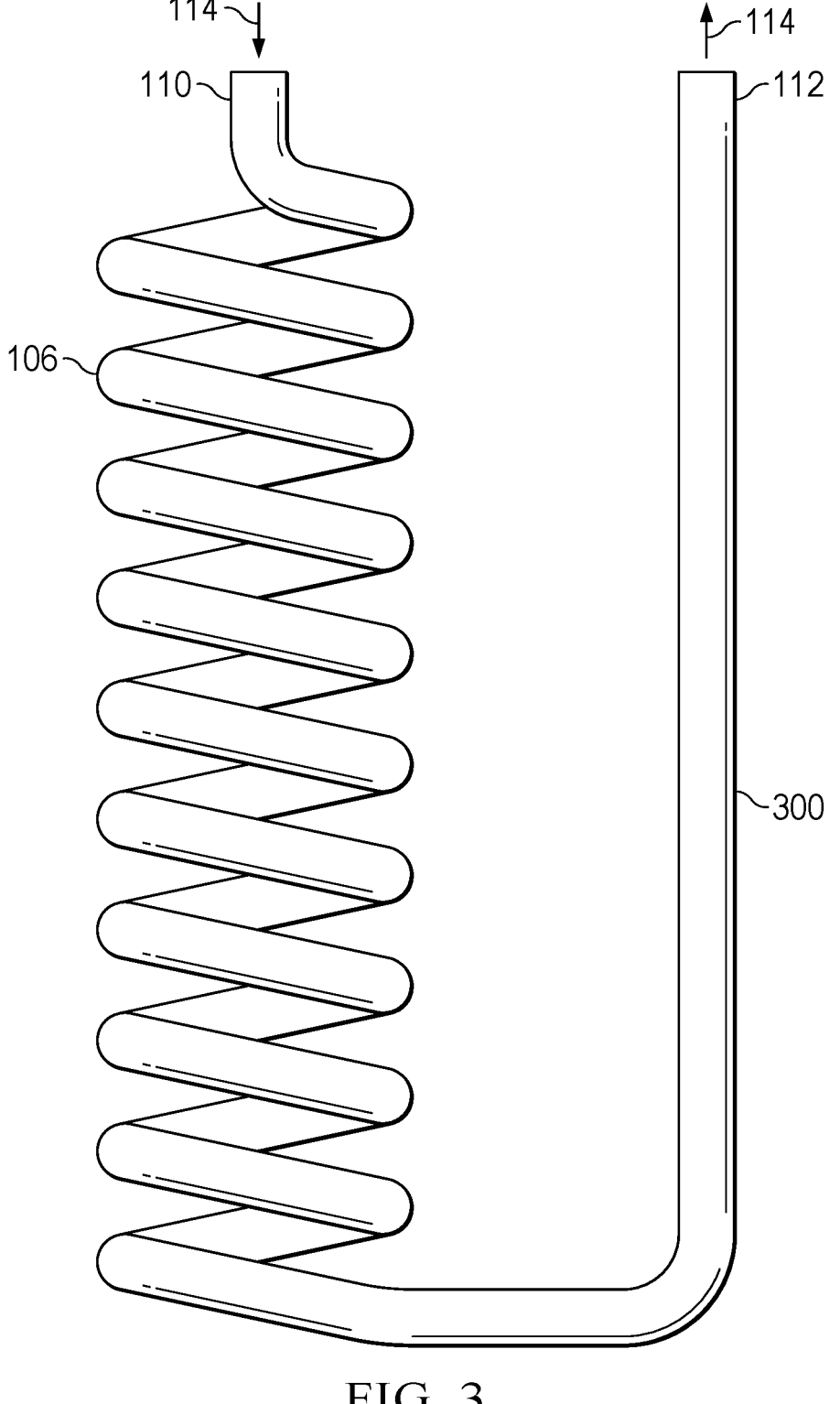
FIG. 3 illustrates a side view of helical conduit(s), in accordance with examples of the present disclosure.

FIG. 3 illustrates a side view of helical conduit(s) 106, in accordance with examples of the present disclosure. The helical shape is included to increase the surface area of the thermoelectric material in the conduit 106. In some examples, a plurality of the helical conduits 106 may be connected within a geothermal reservoir. The fluid 114 may be pumped down the helical conduit 106 via an inlet 110 and back up to the surface through a non-helical pipe 300 (or another helical conduit), and through the outlet 112, for example. The helical shape is included to increase the production of electricity.

Figure 4:
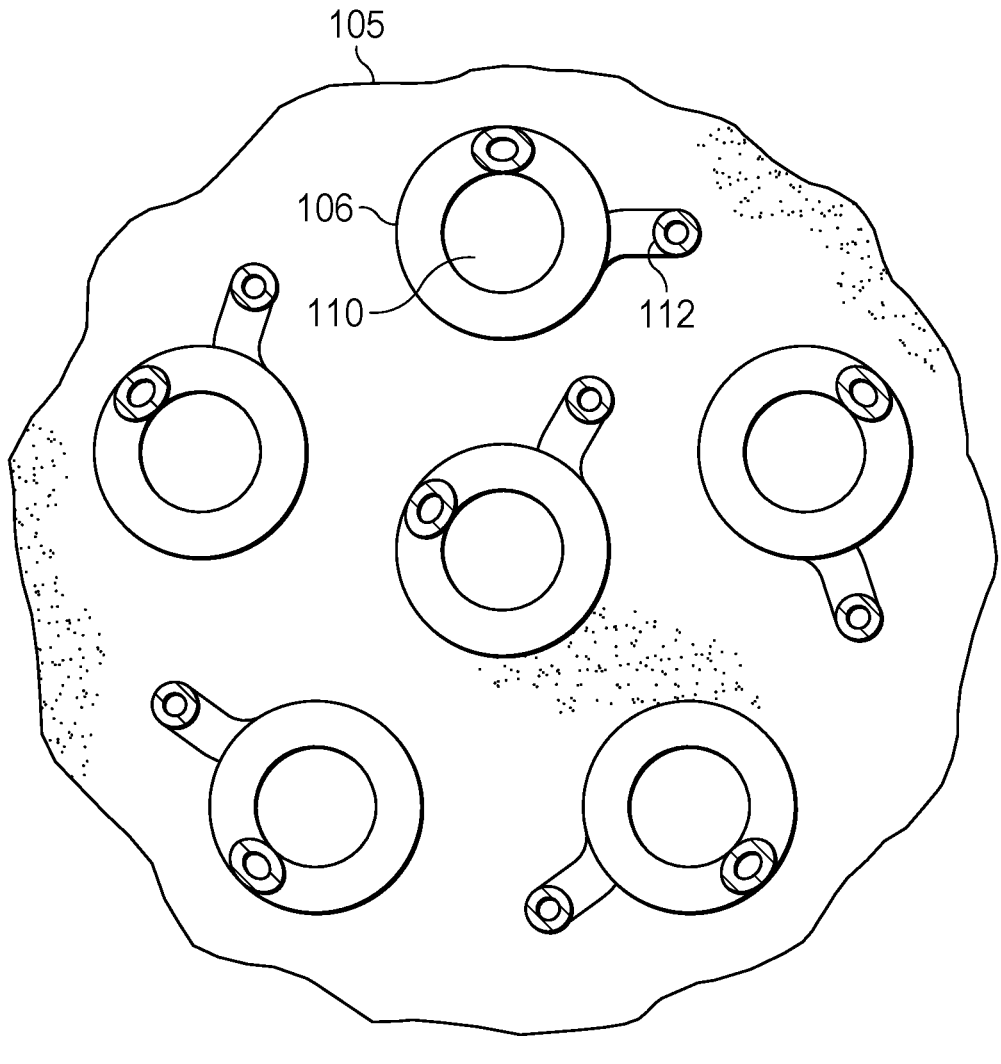
FIG. 4 illustrates a cross-sectional view of the geothermal reservoir that includes multiple helical conduits, in accordance with examples of the present disclosure.

FIG. 4 illustrates a cross-sectional view (e.g., top view) of the geothermal reservoir 105 that includes multiple helical conduits 106, in accordance with examples of the present disclosure. The helical conduits 106 may be connected such that the flow therethrough is also parallel for increased surface area (i.e., increased electricity generation). Each conduit 106 includes an inlet 110 and an outlet 112, as set forth previously.

Figure 5:
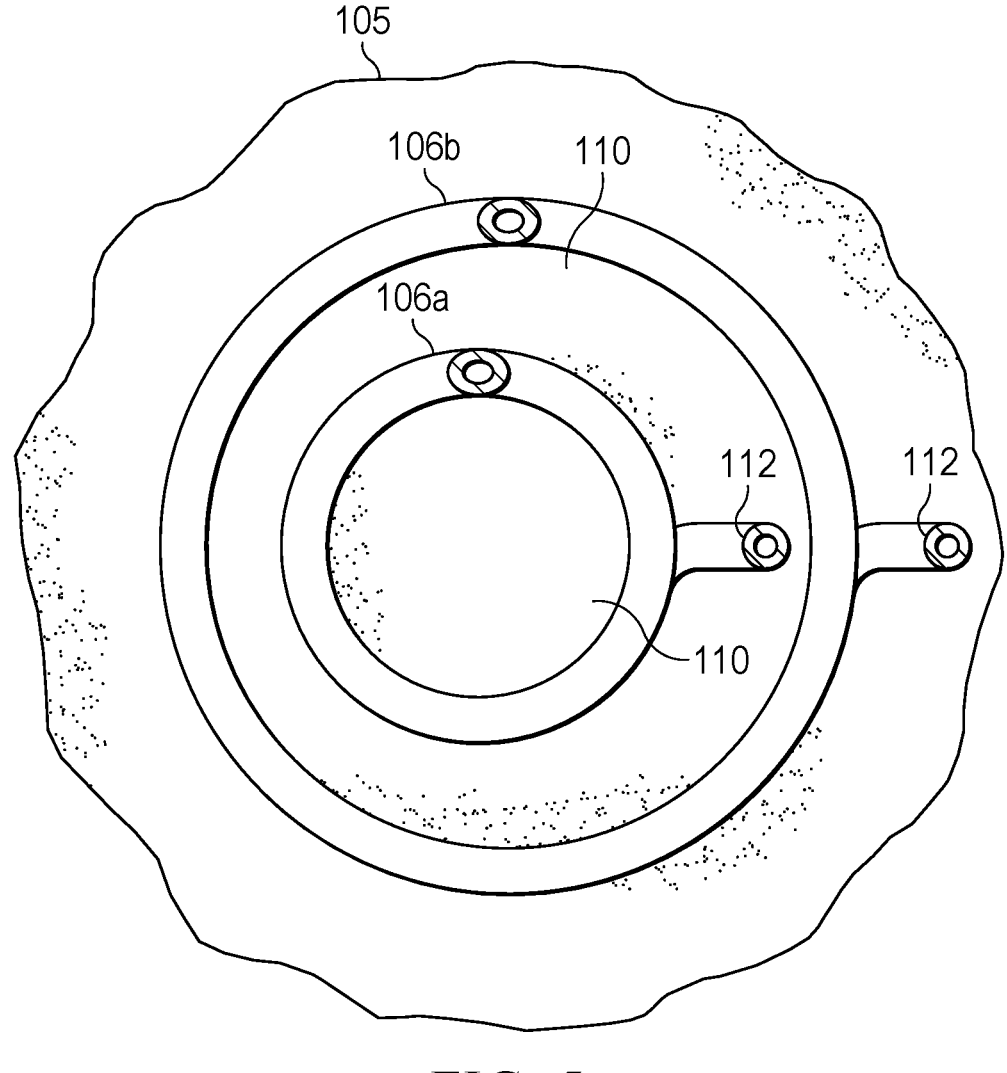
FIG. 5 illustrates a cross-sectional view of the geothermal reservoir that includes a first conduit disposed in a second conduit, in accordance with examples of the present disclosure.

FIG. 5 illustrates a cross-sectional view (e.g., top view) of the geothermal reservoir 105 that includes helical conduits 106a and 106b that are disposed inside each other, in accordance with examples of the present disclosure. The parallel connections in the geothermal reservoir 105 due to this configuration allow for increased electricity production. Each of conduits 106a and 106b includes an inlet 110 and an outlet 112, as set forth previously. As shown, a first conduit 106a (e.g., smaller sized) is disposed in a second conduit 106b (e.g., larger sized). The entire conduit 106a is disposed in the inlet 110 of the second conduit 106b. This configuration increases surface area of the conduit to improve electricity generation.

Figure 6:
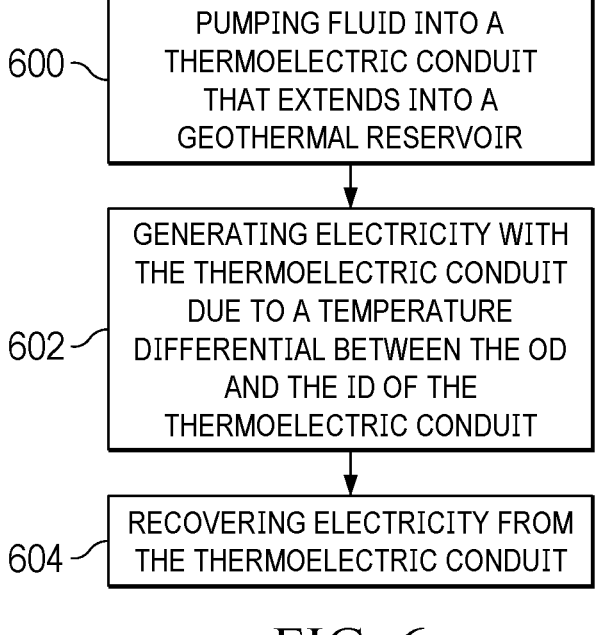
FIG. 6 illustrates an operative sequence for generating electricity underground with thermoelectric conduit(s), in accordance with examples of the present disclosure.

FIG. 6 illustrates an operative sequence for producing electricity in a subterranean formation with thermoelectric conduits extending into a geothermal reservoir, in accordance with examples of the present disclosure. At step 600, fluid is pumped from the surface into a conduit that extends into a subterranean geothermal reservoir (e.g., see FIG. 1A). The conduit may include a shape to maximize surface area to increase electricity production. For example, the conduit(s) may include at least one U-shape pipe (e.g., see FIGS. 1A and 2), at least one helical pipe (e.g., see FIGS. 3 and 4), and/or at least one pipe disposed within another pipe (e.g., see FIG. 5). In some examples, the configuration of the pipes may include eccentric, concentric, and/or coaxial configurations.

At step 602, the temperature differential between the fluid and the geothermal reservoir generates electricity. The Seebeck effect generates the voltage with the thermoelectric material from the temperature difference encountered in the subterranean formation (e.g., pumped-in cold water contacting the hot subterranean geothermal zone). The ID of the conduit has a lower temperature due to the pumped-in cooler fluid that is in contact with the ID (e.g., see FIG. 1B). The OD of the conduit has a higher temperature due to the geothermal reservoir. The fluid may include cold water or water with an ambient temperature, or water that is at least 5° F. or at least 10° F. colder than geothermal reservoir(s). The temperature difference is sufficient to produce energy via the thermoelectric material.

At step 604, the generated electricity is recovered at the surface. For example, a cable(s) (e.g., wires) may extend from the conduit to transfer generated electricity from the conduit to an electrical grid and/or a battery (e.g., see FIG. 1A).

Accordingly, the systems and methods of the present disclosure allow for generating electricity downhole using geothermal energy. The systems and methods may include any of the various features disclosed herein, including one or more of the following statements.

Statement 1. A method comprising: pumping fluid into at least one thermoelectric conduit, the thermoelectric conduit extending into a geothermal reservoir; and generating electricity with the thermoelectric conduit due to a temperature differential between the fluid and the geothermal reservoir.

Statement 2. The method of the statement 1, further comprising recovering the fluid out from the thermoelectric conduit.

Statement 3. The method of the statement 1 or the statement 2, further comprising recovering electricity at a surface of a well, the thermoelectric conduit extending into the well.

Statement 4. The method of any one of the statements 1-3, wherein the fluid includes water.

Statement 5. The method of any one of the statements 1-4, wherein the thermoelectric conduit includes a U-shape to maximize surface area for electricity generation.

Statement 6. The method of any one of the statements 1-5, wherein the thermoelectric conduit includes a helical shape to maximize surface area for electricity generation.

Statement 7. The method of any one of the statements 1-6, wherein a first thermoelectric conduit is disposed in a second thermoelectric conduit to maximize surface area for electricity generation.

Statement 8. The method of any one of the statements 1-7, wherein a temperature of the fluid is less than a temperature of the geothermal reservoir.

Statement 9. The method of any one of the statements 1-8, wherein an inner diameter of the thermoelectric conduit is cooler than an outer diameter of the thermoelectric conduit.

Statement 10. The method of any one of the statements 1-9, wherein a first thermoelectric conduit is disposed in an inlet of a second thermoelectric conduit to maximize surface area for electricity generation.

Statement 11. A system comprising: a thermoelectric conduit extending into a geothermal reservoir; and a fluid source and a pump in communication with the thermoelectric conduit.

Statement 12. The system of the statement 11, wherein the thermoelectric conduit is disposed in a wellbore.

Statement 13. The system of the statements 11 or the statement 12, wherein the thermoelectric conduit includes a U-shape to maximize surface area for electricity generation.

Statement 14. The system of any one of the statements 11-13, wherein the thermoelectric conduit includes a helical shape to maximize surface area for electricity generation.

Statement 15. The system of any one of the statements 11-14, wherein a first thermoelectric conduit is disposed in a second thermoelectric conduit to maximize surface area for electricity generation.

Statement 16. The system of any one of the statements 11-15, wherein an inner diameter of the thermoelectric conduit is cooler than an outer diameter of the thermoelectric conduit.

Statement 17. The system of any one of the statements 11-16, wherein a first thermoelectric conduit is disposed in an inlet of a second thermoelectric conduit to maximize surface area for electricity generation.

Statement 18. The system of any one of the statements 11-17, wherein the fluid includes water.

Statement 19. The system of any one of the statements 11-18, wherein the thermoelectric conduit includes an inlet at a surface of a well.

Statement 20. The system of any one of the statements 11-19, wherein the thermoelectric conduit includes an outlet at a surface of a well.

Although the present disclosure and its advantages have been described in detail, it should be understood that various changes, substitutions, and alterations may be made herein without departing from the spirit and scope of the disclosure as defined by the appended claims. The preceding description provides various examples of the systems and methods of use disclosed herein which may contain different method steps and alternative combinations of components. It should be understood that, although individual examples may be discussed herein, the present disclosure covers all combinations of the disclosed examples, including, without limitation, the different component combinations, method step combinations, and properties of the system. It should be understood that the compositions and methods are described in terms of "comprising," "containing," or "including" various components or steps, the compositions and methods can also "consist essentially of" or "consist of" the various components and steps. Moreover, the indefinite articles "a" or "an," as used in the claims, are defined herein to mean one or more than one of the elements that it introduces.

For the sake of brevity, only certain ranges are explicitly disclosed herein. However, ranges from any lower limit may be combined with any upper limit to recite a range not explicitly recited, as well as ranges from any lower limit may be combined with any other lower limit to recite a range not explicitly recited, in the same way, ranges from any upper limit may be combined with any other upper limit to recite a range not explicitly recited. Additionally, whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values even if not explicitly recited. Thus, every point or individual value may serve as its own lower or upper limit combined with any other point or individual value or any other lower or upper limit, to recite a range not explicitly recited.

Therefore, the present examples are well adapted to attain the ends and advantages mentioned as well as those that are inherent therein. The particular examples disclosed above are illustrative only and may be modified and practiced in different but equivalent manners apparent to those skilled in the art having the benefit of the teachings herein. Although individual examples are discussed, the disclosure covers all combinations of all of the examples. Furthermore, no limitations are intended to the details of construction or design herein shown, other than as described in the claims below. Also, the terms in the claims have their plain, ordinary meaning unless otherwise explicitly and clearly defined by the patentee. It is therefore evident that the particular illustrative examples disclosed above may be altered or modified and all such variations are considered within the scope and spirit of those examples. If there is any conflict in the usages of a word or term in this specification and one or more patent(s) or other documents that may be incorporated herein by reference, the definitions that are consistent with this specification should be adopted.

What is claimed is:

1. A method comprising:

pumping a fluid into an inlet of a first thermoelectric conduit and an inlet of a second thermoelectric conduit, wherein the first thermoelectric conduit and the second thermoelectric conduit extend into a geothermal reservoir, wherein both the first thermoelectric conduit and the second thermoelectric conduit comprise a helical shaped portion, and wherein the helical shaped portion of the first thermoelectric conduit is positioned within the circumference of and circumscribed by the helical shaped portion of the second thermoelectric conduit; and generating electricity with the first thermoelectric conduit and the second thermoelectric conduit due to a temperature differential between the fluid and the geothermal reservoir.

2. The method of claim 1, further comprising recovering the fluid from an outlet of the first thermoelectric conduit and an outlet of the second thermoelectric conduit.

3. The method of claim 2, wherein the first thermoelectric conduit comprises a non-helical return line fluidically coupled to a bottom of the helical shaped portion of the first thermoelectric conduit and the outlet of the first thermoelectric conduit.

4. The method of claim 1, further comprising recovering electricity at a surface of a well, the first thermoelectric conduit and the second thermoelectric conduit extending into the well.

5. The method of claim 1, wherein the fluid includes water.

6. The method of claim 1, wherein the first thermoelectric conduit further includes a U-shape to maximize surface area for electricity generation.

7. The method of claim 1, wherein a temperature of the fluid is less than a temperature of the geothermal reservoir.

8. The method of claim 1, wherein an inner diameter of the first thermoelectric conduit is cooler than an outer diameter of the first thermoelectric conduit.

9. The method of claim 1, wherein the first thermoelectric conduit is disposed in an inlet of the second thermoelectric conduit to maximize surface area for electricity generation.

10. A system comprising:

a first thermoelectric conduit and a second thermoelectric conduit extending into a geothermal reservoir, wherein both the first thermoelectric conduit and the second thermoelectric conduit comprise a helical shaped portion, and wherein the helical shaped portion of the first thermoelectric conduit is positioned within the circumference of and circumscribed by the helical shaped portion of the second thermoelectric conduit; and a fluid source and a pump in communication with the first thermoelectric conduit and the second thermoelectric conduit.

11. The system of claim 10, wherein the first thermoelectric conduit and the second thermoelectric conduit are disposed in a wellbore.

12. The system of claim 11, wherein the first thermoelectric conduit further includes a U-shape to maximize surface area for electricity generation.

13. The system of claim 11, wherein an inner diameter of the first thermoelectric conduit is cooler than an outer diameter of the first thermoelectric conduit.

14. The system of claim 11, wherein the first thermoelectric conduit is disposed in an inlet of the second thermoelectric conduit to maximize surface area for electricity generation.

15. The system of claim 11, wherein the fluid includes water.

16. The system of claim 11, wherein the first thermoelectric conduit includes an inlet at a surface of a wellbore.

17. The system of claim 16, wherein the first thermoelectric conduit includes an outlet at a surface of a wellbore.

18. The system of claim 10, wherein both the first and second thermoelectric conduits further comprise a helical shaped portion followed by a U shaped portion followed by a linear shaped portion.

19. The system of claim 18, wherein the linear shaped portion extends from the U-shaped portion to the surface of the well system.

20. The system of claim 10, wherein the diameter of the second thermoelectric conduit is larger than the diameter of the first thermoelectric conduit.

* * * * *